US007144661B1

(12) United States Patent
Ray et al.

(10) Patent No.: US 7,144,661 B1
(45) Date of Patent: Dec. 5, 2006

(54) MULTILAYER IMAGEABLE ELEMENT WITH IMPROVED CHEMICAL RESISTANCE

(75) Inventors: Kevin B. Ray, Fort Collins, CO (US); Eugene L. Sheriff, Carr, CO (US); Joanne Ray, Fort Collins, CO (US); Andrew Krebs, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/263,879

(22) Filed: Nov. 1, 2005

(51) Int. Cl.
*G03F 7/038* (2006.01)
*G03F 7/11* (2006.01)
*G03F 7/14* (2006.01)

(52) U.S. Cl. .................... 430/15; 430/271.1; 430/302; 430/964

(58) Field of Classification Search .................. 430/15, 430/271.1, 302, 964
See application file for complete search history.

(56) References Cited

U.S. PATENT DOCUMENTS

| | | | | |
|---|---|---|---|---|
| 5,731,127 | A | 3/1998 | Ishizuka et al. | |
| 6,060,217 | A | 5/2000 | Nguyen et al. | |
| 6,143,464 | A | 11/2000 | Kawauchi | |
| 6,294,311 | B1 | 9/2001 | Shimazu et al. | |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,475,692 | B1 | 11/2002 | Jarek et al. | |
| 6,525,152 | B1 | 2/2003 | Jarek | |
| 6,593,055 | B1 | 7/2003 | Shimazu et al. | |
| 6,645,689 | B1 | 11/2003 | Jarek | |
| 6,893,783 | B1 * | 5/2005 | Kitson et al. | 430/15 |
| 2002/0081522 | A1 | 6/2002 | Miyake et al. | |
| 2002/0160299 | A1 | 10/2002 | Asawa et al. | |
| 2003/0203312 | A1 | 10/2003 | Serikawa et al. | |
| 2004/0067432 | A1 | 4/2004 | Kitson et al. | |
| 2005/0037292 | A1 * | 2/2005 | Kitson et al. | 430/348 |
| 2005/0244749 | A1 * | 11/2005 | Kitson et al. | 430/270.1 |

FOREIGN PATENT DOCUMENTS

WO WO 2005/018934 3/2005

OTHER PUBLICATIONS

JP Abstract 11-119419, Apr. 30, 1999, Ikuo.
JP Abstract 2000-330265, Nov. 30, 2000, Ikuo.
U.S. Appl. No. 11/018,335, filed Dec. 21, 2004, "Solvent Resistant Imageable Element" by Kitson and Ray.
U.S. Appl. No. 11/129,844, filed May 16, 2005, "Bakeable Multi-Layer Imageable Element" by Ray and Kitson.

* cited by examiner

*Primary Examiner*—Richard L. Schilling
(74) *Attorney, Agent, or Firm*—J. Lanny Tucker

(57) ABSTRACT

Positive-working imageable elements comprise a radiation absorbing compound and inner and outer layers on a substrate having a hydrophilic surface. The inner layer comprises a polymer that is removable using an alkaline developer and in which from about 1 to about 50 mol % of its recurring units are derived from one or more of the ethylenically unsaturated polymerizable monomers represented by the following Structure (I):

$$CH_2{=}C(R^1)C({=}O)NR^2(CR^3R^4)_nOH \quad (I)$$

wherein $R^1$, $R^2$, $R^3$, and $R^4$ are independently hydrogen, lower alkyl, or phenyl, and n is 1 to 20. The imageable elements having improved resistance to development and printing chemicals and solvents.

20 Claims, No Drawings

MULTILAYER IMAGEABLE ELEMENT WITH IMPROVED CHEMICAL RESISTANCE

FIELD OF THE INVENTION

This invention relates to positive-working imageable elements that have improved thermal bakeability and chemical resistance. It also relates to methods of using these elements to obtain lithographic printing plates and images therefrom.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. For example, the ink can be first transferred to an intermediate blanket that in turn is used to transfer the ink to the surface of the material upon which the image is to be reproduced.

Imageable elements useful to prepare lithographic printing plates typically comprise an imageable layer applied over the hydrophilic surface of a substrate. The imageable layer includes one or more radiation-sensitive components that can be dispersed in a suitable binder. Alternatively, the radiation-sensitive component can also be the binder material. Following imaging, either the imaged regions or the non-imaged regions of the imageable layer are removed by a suitable developer, revealing the underlying hydrophilic surface of the substrate. If the imaged regions are removed, the element is considered as positive-working. Conversely, if the non-imaged regions are removed, the element is considered as negative-working. In each instance, the regions of the imageable layer (that is, the image areas) that remain are ink-receptive, and the regions of the hydrophilic surface revealed by the developing process accept water and aqueous solutions, typically a fountain solution, and repel ink.

Imaging of the imageable element with ultraviolet and/or visible radiation is typically carried out through a mask that has clear and opaque regions. Imaging takes place in the regions under the clear regions of the mask but does not occur in the regions under the opaque mask regions. If corrections are needed in the final image, a new mask must be made. This is a time-consuming process. In addition, dimensions of the mask may change slightly due to changes in temperature and humidity. Thus, the same mask, when used at different times or in different environments, may give different results and could cause registration problems.

Direct digital imaging has obviated the need for imaging through a mask and is becoming increasingly important in the printing industry. Imageable elements for the preparation of lithographic printing plates have been developed for use with infrared lasers. Thermally imageable, multi-layer elements are described, for example, U.S. Pat. No. 6,294,311 (Shimazu et al.), U.S. Pat. No. 6,352,812 (Shimazu et al.), U.S. Pat. No. 6,593,055 (Shimazu et al.), U.S. Pat. No. 6,352,811 (Patel et al.), U.S. Pat. No. 6,358,669 (Savariar- Hauck et al.), and U.S. Pat. No. 6,528,228 (Savariar-Hauck et al.), U.S. Patent Application Publication 2004/0067432 A1 (Kitson et al.).

Problem to be Solved

In use, a lithographic printing plate comes into contact with fountain solutions and inks. In addition, the element is often subjected to blanket washes to remove inks and various cleaning solutions for blanket and press rollers. Despite the progress in various positive-working imageable elements, there is a continuing need for imageable elements that are both thermally bakeable and resistant to press chemistries, such as inks, fountain solution, and the solvents used in washes, such as UV washes. Thermal bakeability is highly desirable because provides increased press run length.

SUMMARY OF THE INVENTION

This invention provides a positive-working imageable element comprising a radiation absorbing compound and a substrate having a hydrophilic surface, and having thereon, in order:

an inner layer comprising a polymeric material that is removable using an alkaline developer and in which from about 1 to about 50 mol % of its recurring units are derived from one or more of the ethylenically unsaturated polymerizable monomers represented by the following Structure (I):

$$CH_2{=}C(R^1)C({=}O)NR^2(CR^3R^4)_nOH \quad (I)$$

wherein $R^1$, $R^2$, $R^3$, and $R^4$ are independently hydrogen, lower alkyl, or phenyl, and n is 1 to 20, and an ink receptive outer layer that is substantially free of the radiation absorbing compound and is not removable by an alkaline developer prior to thermal imaging, provided upon thermal imaging, the imaged regions of the element are removable by an alkaline developer.

In another aspect, this invention provides a method for forming an image comprising:

A) thermally imaging a positive-working imageable element comprising a radiation absorbing compound and a substrate having a hydrophilic surface, and having thereon, in order:

an inner layer comprising a polymeric material that is removable using an alkaline developer and in which from about 1 to about 50 mol % of its recurring units are derived from one or more of the ethylenically unsaturated polymerizable monomers represented by the following Structure (I):

$$CH_2{=}C(R^1)C({=}O)NR^2(CR^3R^4)_nOH \quad (I)$$

wherein $R^1$, $R^2$, $R^3$, and $R^4$ are independently hydrogen, lower alkyl, or phenyl, and n is 1 to 20, and an ink receptive outer layer that is substantially free of the radiation absorbing compound and is not removable by an alkaline developer prior to thermal imaging, provided upon thermal imaging, the imaged regions of the element are removable by an alkaline developer, thereby forming an imaged element with imaged and non-imaged regions wherein the imaged regions are removable by an alkaline developer following thermal imaging of the element, B) contacting the imaged element with an alkaline developer to remove only the imaged regions, revealing the hydrophilic substrate, and C) optionally, baking the imageable element after imaging and development.

The multi-layer imageable elements of this invention have been found to have increased "chemical resistance", that is resistance to breakdown of the various layers from chemicals and solvents used in development and printing. In addition, the multi-layer imageable elements can be baked to increase press run length.

DETAILED DESCRIPTION OF THE INVENTION

Definitions

Unless the context indicates otherwise, when used herein, the terms "imageable element" and "printing plate precursor" are meant to be references to embodiments of the present invention.

In addition, unless the context indicates otherwise, the various components described herein such as the polymer of Structure I in the inner layer, "colorant", "coating solvent", "radiation absorbing compound", "surfactant", "phenolic resin", "monomeric or polymeric compound comprising a benzoquinone diazide moiety and/or a naphthoquinone diazide moiety", "alkaline developer", and similar terms also refer to mixtures of such components. Thus, the use of the article "a" or "an" is not necessarily meant to refer to only a single component.

Unless otherwise indicated, percentages refer to percentages by dry weight.

For clarification of definitions for any terms relating to polymers, reference should be made to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

Unless otherwise indicated, the term "polymer" refers to high and low molecular weight polymers including oligomers and includes homopolymers and copolymers.

The term "copolymer" refers to polymers that are derived from two or more different monomers. That is, they comprise recurring units having at least two different chemical structures.

The term "backbone" refers to the chain of atoms in a polymer to which a plurality of pendant groups are attached. An example of such a backbone is an "all carbon" backbone obtained from the polymerization of one or more ethylenically unsaturated polymerizable monomers. However, other backbones can include heteroatoms wherein the polymer is formed by a condensation reaction or some other means.

Uses

The imageable elements can be used in a number of ways. The preferred use is as precursors to lithographic printing plates as described in more detail below. However, this is not meant to be the only use of the present invention. For example, the imageable elements can also be used as thermal patterning systems and to form masking elements and printed circuit boards.

Imageable Element

In general, the imageable element of this invention comprises a substrate, an inner layer (also known as an "underlayer"), and an outer layer (also known as a "top layer") disposed over the inner layer. Before thermal imaging, the outer layer is not removable by an alkaline developer, but after thermal imaging, the imaged regions of the outer layer are removable by the alkaline developer. The inner layer is also removable by the alkaline developer. A radiation absorbing compound, generally an infrared radiation absorbing compound (defined below), is present in the imageable element. Preferably, this compound is in the inner layer and optionally also in a separate layer between the inner and outer layers.

The imageable elements are formed by suitable application of an inner layer composition to a suitable substrate. This substrate can be an untreated or uncoated support but it is usually treated or coated in various ways as described below prior to application of the inner layer composition. The substrate generally has a hydrophilic surface or at least a surface that is more hydrophilic than the outer layer composition. The substrate comprises a support that can be composed of any material that is conventionally used to prepare imageable elements such as lithographic printing plates. It is usually in the form of a sheet, film, or foil, and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Polymeric film supports may be modified on one or both surfaces with a "subbing" layer to enhance hydrophilicity, or paper supports may be similarly coated to enhance planarity. Examples of subbing layer materials include but are not limited to, alkoxysilanes, amino-propyltriethoxysilanes, glycidioxypropyl-triethoxysilanes, and epoxy functional polymers, as well as conventional hydrophilic subbing materials used in silver halide photographic films (such as gelatin and other naturally occurring and synthetic hydrophilic colloids and vinyl polymers including vinylidene chloride copolymers).

A preferred substrate is composed of an aluminum support that may be treated using techniques known in the art, including physical graining, electrochemical graining, chemical graining, and anodizing. Preferably, the aluminum sheet has been subjected to electrochemical graining and is anodized.

An interlayer may be formed by treatment of the aluminum support with, for example, a silicate, dextrine, calcium zirconium fluoride, hexafluorosilicic acid, phosphate/fluoride, poly(vinyl phosphonic acid) (PVPA), vinyl phosphonic acid copolymer, poly(acrylic acid), or acrylic acid copolymer. Preferably, the grained and anodized aluminum support is treated with PVPA using known procedures to improve surface hydrophilicity.

The thickness of the substrate can be varied but should be sufficient to sustain the wear from printing and thin enough to wrap around a printing form. Preferred embodiments include a treated aluminum foil having a thickness of from about 100 to about 600 μm.

The backside (non-imaging side) of the substrate may be coated with antistatic agents and/or slipping layers or a matte layer to improve handling and "feel" of the imageable element.

The substrate can also be a cylindrical surface having the various layer compositions applied thereon, and thus be an integral part of the printing press. The use of such imaged cylinders is described for example in U.S. Pat. No. 5,713,287 (Gelbart).

Inner Layer

The inner layer is disposed between the outer layer and the substrate and, typically, disposed directly on the substrate. The inner layer comprises a polymeric material containing hydroxy groups on side chains. This polymeric material is removable by the developer and preferably soluble in the developer to reduce sludging of the developer. In addition, the polymeric material is preferably insoluble in the solvent used to coat the outer layer so that the outer layer can be coated over the inner layer without dissolving the inner layer.

The hydroxy-containing polymeric materials used in the inner layer are composed of recurring units derived from two or more ethylenically unsaturated monomers wherein from about 1 to about 50 mol % (preferably from about 10 to about 40 mol %) of the recurring units are derived from on or more of the monomers represented by the following Structure (I):

$$CH_2{=}C(R^1)C({=}O)NR^2(CR^3R^4)_nOH \quad \text{(I)}$$

in which $R^1$, $R^2$, $R^3$, $R^4$ are independently hydrogen, substituted or unsubstituted lower alkyl having 1 to 10 carbon atoms (such as methyl, chloromethyl, ethyl, iso-propyl, t-butyl, and n-decyl), or substituted or unsubstituted phenyl, and "n" 1 to 20.

Preferably, $R^1$ is hydrogen, methyl, or phenyl, and more preferably it is hydrogen or methyl. In addition, preferably $R^2$, $R^3$, and $R^4$ are independently hydrogen, methyl, ethyl, or phenyl, and more preferably, $R^2$ is hydrogen and $R^3$ and $R^4$ are independently hydrogen, methyl, or phenyl. Also, "n" is preferably 1 to 10 and more preferably 1 to 5.

In preferred embodiments, the hydroxy-containing polymeric material in the inner layer is represented by the following Structure (II):

$$—(A)_x—(B)_y—(C)_z— \quad \text{(II)}$$

wherein A represents recurring units represented by the following Structure (Ia):

(Ia)

$$\text{-----}[CH_2—C(R^1)]\text{-----}$$
$$|$$
$$C({=}O)NR^2(CR^3R^4)_nOH$$

wherein $R^1$ through $R^4$ and "n" are as defined above for Structure (I).

In Structure (II), B represents recurring units comprising acidic functionality or an N-maleimide group, and C represents recurring units different from A and B, "x" is from about 1 to about 50 mol % (preferably from about 10 to about 40 mol %), "y" is from about 40 to about 90 mol % (from about 40 to about 70 mol %), and "z" is 0 to about 70 mol % (preferably from 0 to about 50 mol %), based on total recurring units.

In some embodiments of Structure (II):

A represents recurring units derived from one or both of N-hydroxymethylacrylamide and N-hydroxymethylmethacrylamide, B represents recurring units derived from one or more of N-phenylmaleimide, N-cyclohexylmaleimide, N-benzylmaleimide, N-(4-carboxyphenyl)maleimide, (meth)acrylic acid, and vinyl benzoic acid, C represents recurring units derived from one or more of a styrenic monomer (such as styrene and derivatives thereof), meth(acrylate) ester, N-substituted (meth)acrylamide, maleic anhydride, (meth)acrylonitrile, allyl acrylate, and a compound represented by the following Structure (III):

(III)

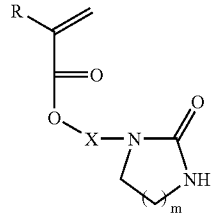

wherein R is hydrogen, methyl, or halo, X is alkylene having 2 to 12 carbon atoms, and "m" is 1 to 3, "x" is from about 10 to 40 mol %, "y" is from about 40 to about 70 mol %, and "z" is from 0 to about 50 mol %, all based on total recurring units.

In more preferred embodiments, B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth)acrylic acid and vinyl benzoic acid in an amount of from about 10 to about 30 mol %, based on total recurring units.

In such embodiments, C represents recurring units derived from methacrylamide, (meth)acrylonitrile, maleic anhydride,

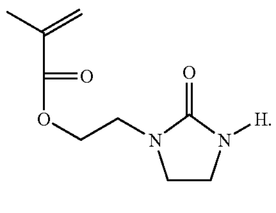

The hydroxy-containing polymeric material described above is generally present in the inner layer at a coverage of from about 50 to about 95 weight %, and preferably at from about 60 to about 85 weight %, based on total dry layer weight.

Preferably, the inner layer further comprises a radiation absorbing compound (preferably an infrared radiation absorbing compound) that absorbs radiation at from about 600 to about 1200 and preferably at from about 700 to about 1200 nm, with minimal absorption at from about 300 to about 600 nm. This compound (sometimes known as a "photothermal conversion material") absorbs radiation and converts it to heat. This compound may be either a dye or pigment. Examples of useful pigments are ProJet 900, ProJet 860 and ProJet 830 (all available from the Zeneca Corporation). Although a radiation absorbing compound is not necessary for imaging with a hot body, the imageable elements containing a radiation absorbing compounds may also be imaged with a hot body, such as a thermal head or an array of thermal heads.

Useful IR absorbing compounds also include carbon blacks including carbon blacks that are surface-functionalized with solubilizing groups are well known in the art. Carbon blacks that are grafted to hydrophilic, nonionic polymers, such as FX-GE-003 (manufactured by Nippon Shokubai), or which are surface-functionalized with anionic groups, such as CAB-O-JET® 200 or CAB-O-JET® 300 (manufactured by the Cabot Corporation) are also useful.

IR dyes (especially those that are soluble in an alkaline developer) are preferred to prevent sludging of the developer by insoluble material. Examples of suitable IR dyes include but are not limited to, azo dyes, squarylium dyes, croconate dyes, triarylamine dyes, thioazolium dyes, indolium dyes, oxonol dyes, oxaxolium dyes, cyanine dyes, merocyanine dyes, phthalocyanine dyes, indocyanine dyes, indoaniline dyes, merostyryl dyes, indotricarbocyanine dyes, oxatricarbocyanine dyes, thiocyanine dyes, thiatricarbocyanine dyes, merocyanine dyes, cryptocyanine dyes, naphthalocyanine dyes, polyaniline dyes, polypyrrole dyes, polythiophene dyes, chalcogenopyryloarylidene and bi(chalcogenopyrylo) polymethine dyes, oxyindolizine dyes, pyrylium dyes, pyrazoline azo dyes, oxazine dyes, naphthoquinone dyes, anthraquinone dyes, quinoneimine dyes, methine dyes, arylmethine dyes, squarine dyes, oxazole dyes, croconine dyes, porphyrin dyes, and any substituted or ionic form of the preceding dye classes. Suitable dyes are also described in numerous publications including U.S. Pat. No. 6,294,311 (noted above) and U.S. Pat. No. 5,208,135 (Patel et al.) and the references cited thereon, that are incorporated herein by reference.

Examples of useful IR absorbing compounds include ADS-830A and ADS-1064 (American Dye Source, Baie D'Urfe, Quebec, Canada), EC2117 (FEW, Wolfen, Germany), Cyasorb® IR 99 and Cyasorb® IR 165 (GPTGlendale Inc. Lakeland, Fla.), and IR Absorbing Dye A used in the Examples below.

Near infrared absorbing cyanine dyes are also useful and are described for example in U.S. Pat. No. 6,309,792 (Hauck et al.), U.S. Pat. No. 6,264,920 (Achilefu et al.), U.S. Pat. No. 6,153,356 (Urano et al.), U.S. Pat. No. 5,496,903 (Watanate et al.). Suitable dyes may be formed using conventional methods and starting materials or obtained from various commercial sources including American Dye Source (Canada) and FEW Chemicals (Germany). Other useful dyes for near infrared diode laser beams are described, for example, in U.S. Pat. No. 4,973,572 (DeBoer).

In addition to low molecular weight IR-absorbing dyes, IR dye moieties bonded to polymers can be used as well. Moreover, IR dye cations can be used, that is, the cation is the IR absorbing portion of the dye salt that ionically interacts with a polymer comprising carboxy, sulfo, phosphor, or phosphono groups in the side chains.

The radiation absorbing compound can be present in an amount of generally at least 10% and up to 30% and preferably from about 12 to about 25%, based on the total inner layer dry weight. The particular amount needed of a given IR absorbing compound could be readily determined by one skilled in the art.

The inner layer can include other components such as surfactants, dispersing aids, humectants, biocides, viscosity builders, drying agents, defoamers, preservatives, antioxidants, colorants, and other polymers such as novolaks, resoles, or resins that have activated methylol and/or activated alkylated methylol groups.

The inner layer generally has a dry coating coverage of from about 0.5 to about 2.5 $g/m^2$ and preferably from about 1 to about 2 $g/m^2$.

Outer Layer

The outer layer is disposed over the inner layer and in preferred embodiments there are no intermediate layers between the inner and outer layers. The outer layer becomes soluble or dispersible in the developer following thermal exposure. It typically comprises one or more ink-receptive polymeric materials, known as polymer binders, and a dissolution inhibitor or colorant. Alternatively, or additionally, a polymer binder comprises polar groups and acts as both the binder and dissolution inhibitor. The outer layer is substantially free of radiation absorbing compounds, meaning that none of those compounds are purposely incorporated therein and insubstantial amounts diffuse into it from other layers.

Any polymer binders used in outer layers of prior art multi-layer thermally imageable elements may be used in the imageable elements of this invention. For example, the polymer binders can be one or more of those described in U.S. Pat. No. 6,358,669 (Savariar-Hauck), U.S. Pat. No. 6,555,291 (Hauck), U.S. Pat. No. 6,352,812 (Shimazu et al.), U.S. Pat. No. 6,352,811 (Patel et al.), U.S. Pat. No. 6,294,311 (Shimazu et al.), U.S. Pat. No. 6,893,783 (Kitson et al.), and U.S. Pat. No. 6,645,689 (Jarek), U.S. Patent Application Publications 2003/0108817 (Patel et al) and 2003/0162,126 (Kitson et al.), and WO 2005/018934 (Kitson et al.).

Preferably, the polymer binder in the outer layer is a light-stable, water-insoluble, aqueous alkaline developer-soluble, film-forming phenolic resins that has a multiplicity of phenolic hydroxyl groups. Phenolic resins have a multiplicity of phenolic hydroxyl groups, either on the polymer backbone or on pendent groups. Novolak resins, resol resins, acrylic resins that contain pendent phenol groups, and polyvinyl phenol resins are preferred phenolic resins. Novolak resins are more preferred.

Novolak resins are commercially available and are well known to those in the art. Novolak resins are typically prepared by the condensation reaction of a phenol, such as phenol, m-cresol, o-cresol, p-cresol, etc, with an aldehyde, such as formaldehyde, paraformaldehyde, acetaldehyde, etc. or ketone, such as acetone, in the presence of an acid catalyst. The weight average molecular weight is typically about 1,000 to 15,000. Typical novolak resins include, for example, phenol-formaldehyde resins, cresol-formaldehyde resins, phenol-cresol-formaldehyde resins, p-t-butylphenol-formaldehyde resins, and pyrogallol-acetone resins. Particularly useful novolak resins are prepared by reacting m-cresol, mixtures of m-cresol and p-cresol, or phenol with formaldehyde using conditions well known to those skilled in the art.

A solvent soluble novolak resin is one that is sufficiently soluble in a coating solvent to produce a coating solution that can be coated to produce an outer layer. In some cases, it may be desirable to use a novolak resin with the highest weight-average molecular weight that maintains its solubility in common coating solvents, such as acetone, tetrahydrofuran, and 1-methoxypropan-2-ol. Outer layers comprising novolak resins, including for example m-cresol only novolak resins (i.e. those that contain at least about 97 mol-% m-cresol) and m-cresol/p-cresol novolak resins that have up to 10 mol-% of p-cresol, having a weight average molecular weight of at least 10,000 and preferably at least 25,000, may be used. Outer layers comprising m-cresol/p-cresol novolak resins with at least 10 mol-% of p-cresol, having a weight average molecular weight of about 8,000 up to about 25,000, may also be used. In some instances, novolak resins prepared by solvent condensation may be desirable. Outer layers comprising these resins are disclosed for example in U.S. Pat. No. 6,858,359 (Kitson, et al.), the disclosure of which is incorporated herein by reference.

Other useful poly(vinyl phenol) resins include polymers of one or more hydroxyphenyl containing monomers such as hydroxystyrenes and hydroxyphenyl (meth)acrylates. Other monomers not containing hydroxy groups can be copolymerized with the hydroxy-containing monomers. These resins can be prepared by polymerizing one or more of the monomers in the presence of a radical initiator or a cationic polymerization initiator using known reaction conditions. The weight average molecular weight ($M_w$) of these polymers, measured as described above for the novolak resins, of the novolak resins is from about 1000 to about 200,000 g/mol, and more preferably from about 1,500 to about 50,000 g/mol.

Examples of useful hydroxy-containing polymers include ALNOVOL SPN452, SPN400, HPN100 (Clariant GmbH), DURITE PD443, SD423A, SD126A (Borden Chemical, Inc.), BAKELITE 6866LB02, AG, 6866LB03 (Bakelite AG), KR 400/8 (Koyo Chemicals Inc.), HRJ 1085 and 2606 (Schnectady International, Inc.), and Lyncur CMM (Siber Hegner), all of which are described in U.S. Patent Application Publication 2005/0037280 (noted above). A particularly useful polymer is PD-140A described for the Examples below.

The outer layer can also include a phenolic resin binder that comprises phenolic recurring units that are substituted by the group represented by Structure (Q) shown as follows:

(Q)

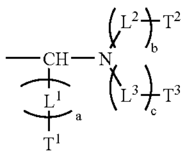

wherein $L^1$, $L^2$, and $L^3$ independently represent linking groups, $T^1$, $T^2$, and $T^3$ independently represent terminal groups, and "a", "b", and "c" are independently 0 or 1.

More particularly, each of $L^1$, $L^2$, and $L^3$ is independently a substituted or unsubstituted alkylene having 1 to 4 carbon atoms (such as methylene, 1,2-ethylene, 1,1-ethylene, n-propylene, iso-propylene, t-butylene, and n-butylene groups), substituted cycloalkylene having 5 to 7 carbon atoms in the cyclic ring (such as cyclopentylene and 1,4-cyclohexylene), substituted or unsubstituted arylene having 6 to 10 carbon atoms in the aromatic ring (such as 1,4-phenylene, naphthylene, 2-methyl-1,4-phenylene, and 4-chloro-1,3-phenylene groups), or substituted or unsubstituted, aromatic or non-aromatic divalent heterocyclic group having 5 to 10 carbon and one or more heteroatoms (nitrogen, oxygen, or sulfur atoms) in the cyclic ring (such as pyridylene, pyrazylene, pyrimidylene, or thiazolylene groups), or any combinations of two or more of these divalent linking groups. Alternatively, $L^2$ and $L^3$ together can represent the necessary atoms to form a carbocyclic or heterocyclic ring structure. Preferably, $L^1$ is a carbon-hydrogen single bond or a methylene, ethylene, or phenylene group, and $L^2$ and $L^3$ are independently hydrogen, methyl, ethyl, 2-hydroxyethyl, or cyclic $-(CH_2)_2O(CH_2CH_2)-$ groups.

$T^1$, $T^2$, and $T^3$ are independently terminal groups such as hydrogen, or substituted or unsubstituted alkyl groups having 1 to 10 carbon atoms (such as methyl, ethyl, iso-propyl, t-butyl, n-hexyl, methoxymethyl, phenylmethyl, hydroxyethyl, and chloroethyl groups), substituted or unsubstituted alkenyl groups having 2 to 10 carbon atoms (such as ethenyl and hexenyl groups), substituted or unsubstituted alkynyl groups (such as ethynyl and octynyl groups), substituted or unsubstituted cycloalkyl groups having 5 to 7 carbon atoms in the cyclic ring (such as cyclopentyl, cyclohexyl, and cycloheptyl groups), substituted or unsubstituted heterocyclic groups (both aromatic and non-aromatic) having a carbon atom and one or more heteroatoms in the ring (such as pyridyl, pyrazyl, pyrimidyl, thiazolyl, and indolyl groups), and substituted or unsubstituted aryl groups having 6 to 10 carbon atoms in the aromatic ring (such as phenyl, naphthyl, 3-methoxyphenyl, benzyl, and 4-bromophenyl groups). Alternatively, $T^2$ and $T^3$ together represent the atoms necessary to form a cyclic structure that can also contain fused rings. In addition, when "a" is 0, $T^3$ is not hydrogen.

These phenolic resin binders can be prepared by the reaction of a phenolic monomeric unit with a first compound comprising an aldehyde group and a second compound comprising an amine group as described in U.S. Patent Application Publication 2005/0037280 (noted above), incorporated herein by reference.

These phenolic resin binders can contain more than one type of substituted Structure (Q) group. The different Structure (Q) groups can be incorporated successively or as a mixture of different first and second compounds in the reaction with the hydroxy-containing polymer. The amount and type of Structure (Q) group is limited only by the solubility of the resulting modified phenolic resin binder in the alkaline developer. Generally, at least 0.5 mol % and up to 50 mol % of the phenolic resin binder recurring units comprise the same or different Structure (Q) groups. Preferably, the Structure (Q) groups are present in from about 1 to about 40 mol %, and more preferably from about 2 to about 30 mol % of the recurring units.

The outer layer can also include non-phenolic polymeric materials as film-forming binder materials in addition to or instead of the phenolic resins described above. Such non-phenolic polymeric materials include polymers formed from maleic anhydride and one or more styrenic monomers (that is styrene and styrene derivatives having various substituents on the benzene ring), polymers formed from methyl methacrylate and one or more carboxy-containing monomers, and mixtures thereof. These polymers can comprises recurring units derived from the noted monomers as well as recurring units derived from additional, but optional monomers [such as (meth)acrylates, (meth)acrylonitrile and (meth)acrylamides].

The polymers derived from maleic anhydride generally comprise from about 1 to about 50 mol % of recurring units derived from maleic anhydride and the remainder of the recurring units derived from the styrenic monomers and optionally additional polymerizable monomers.

The polymer formed from methyl methacrylate and carboxy-containing monomers generally comprise from about 80 to about 98 mol % of recurring units derived from methyl methacrylate. The carboxy-containing recurring units can be derived, for example, from acrylic acid, methacrylic acid, itaconic acid, maleic acid, and similar monomers known in the art.

The outer layer can also comprise one or more polymer binders having pendant epoxy groups sufficient to provide an epoxy equivalent weight of from about 130 to about 1000 (preferably from about 140 to about 750). "Epoxy equivalent weight" refers to the weight of the polymer (grams) divided by the number of equivalence of epoxy groups (number of moles) in the polymer. Any film-forming polymer containing the requisite pendant epoxy groups can be used including condensation polymers, acrylic resins, and urethane resins. The pendant epoxy groups can be part of the polymerizable monomers or reactive components used to make the polymers, or they can be added after polymerization using known procedures. Preferably, the outer layer comprises one or more acrylic resins that are derived from one or more ethylenically unsaturated polymerizable monomers, at least one of which monomers comprises pendant epoxy groups such as those described in copending and commonly assigned U.S. Ser. No. 11/257,864 (filed Oct. 25, 2005 by Huang, Saraiya, Ray, Kitson, Sheriff, and Krebs and entitled MULTILAYER IMAGEABLE ELEMENT CONTAINING EPOXY RESIN), that is incorporated herein by reference.

Particularly useful polymers of this type have pendant epoxy groups attached to the polymer backbone through a carboxylic acid ester group such as a substituted or unsubstituted —C(O)O-alkylene, —C(O)O-alkylene-phenylene-, or —C(O)O-phenylene group wherein alkylene has 1 to 4 carbon atoms. Preferred ethylenically unsaturated polymerizable monomers having pendant epoxy groups useful to make these polymer binders include glycidyl acrylate, glycidyl methacrylate, 3,4-epoxycyclohexyl methacrylate, and 3,4-epoxycyclohexyl acrylate.

The epoxy-containing polymers can also comprise recurring units derived from one or more ethylenically unsaturated polymerizable monomers that do not have pendant epoxy groups including but not limited to, (meth)acrylates, (meth)acrylamides, vinyl ether, vinyl esters, vinyl ketones, olefins, unsaturated imides (such as maleimide), N-vinyl pyrrolidones, N-vinyl carbazole, vinyl pyridines, (meth) acrylonitriles, and styrenic monomers. Of these, the (meth) acrylates, (meth)acrylamides, and styrenic monomers are preferred and the styrenic monomers are most preferred. For example, a styrenic monomer could be used in combination with methacrylamide, acrylonitrile, maleimide, vinyl acetate, or N-vinyl pyrrolidone.

Preferably, the outer layer is free of compounds that act as hardeners for the pendant epoxy groups but in some embodiments, conventional hardeners can be present.

The one or more polymer binders are present in the outer layer in an amount of at least 60 weight %, and preferably from about 65 to about 99.5 weight %.

The outer layer generally and optionally comprises a dissolution inhibitor that functions as a solubility-suppressing component for the binder. Dissolution inhibitors generally have polar functional groups that are thought to act as acceptor sites for hydrogen bonding, such as with hydroxyl groups of the binder. Dissolution inhibitors that are soluble in the developer are most suitable. Alternatively, or additionally, the polymer binder may contain solubility-suppressing polar groups that function as the dissolution inhibitor.

Useful dissolution inhibitor compounds are described for example in U.S. Pat. No. 5,705,308 (West, et al.), U.S. Pat. No. 6,060,222 (West, et al.), and U.S. Pat. No. 6,130,026 (Bennett, et al.), each of which is incorporated herein by reference.

Compounds that contain a positively charged (i.e., quaternized) nitrogen atom useful as dissolution inhibitors include, for example, tetraalkyl ammonium compounds, quinolinium compounds, benzothiazolium compounds, pyridinium compounds, and imidazolium compounds. Representative tetraalkyl ammonium dissolution inhibitor compounds include tetrapropyl ammonium bromide, tetraethyl ammonium bromide, tetrapropyl ammonium chloride, and trimethylalkyl ammonium chlorides and trimethylalkyl ammonium bromides, such as trimethyloctyl ammonium bromide and trimethyldecyl ammonium chloride. Representative quinolinium dissolution inhibitor compounds include 1-ethyl-2-methyl quinolinium iodide, 1-ethyl-4-methyl quinolinium iodide and cyanine dyes that comprise a quinolinium moiety such as Quinoldine Blue. Representative benzothiazolium compounds include 3-ethyl-2(3H)-benzothiazolylidene)-2-methyl-1-(propenyl)benzothiazolium cationic dyes and 3-ethyl-2-methyl benzothiazolium iodide.

Diazonium salts are useful as dissolution inhibitor compounds and include, for example, substituted and unsubstituted diphenylamine diazonium salts, such as methoxy-substituted diphenylamine diazonium hexafluoroborates. Representative sulfonic acid esters useful as dissolution inhibitor compounds include ethyl benzene sulfonate, n-hexyl benzene sulfonate, ethyl p-toluene sulfonate, t-butyl p-toluene sulfonate, and phenyl p-toluene sulfonate. Representative phosphate esters include trimethyl phosphate, triethyl phosphate, and tricresyl phosphate. Useful sulfones include those with aromatic groups, such as diphenyl sulfone. Useful amines include those with aromatic groups, such as diphenylamine and triphenylamine.

Keto-containing compounds useful as dissolution inhibitor compounds include, for example, aldehydes, ketones, especially aromatic ketones, and carboxylic acid esters. Representative aromatic ketones include xanthone, flavanones, flavones, 2,3-diphenyl-1-indenone, 1'-(2'-acetonaphthonyl)benzoate, 2,6-diphenyl-4H-pyran-4-one and 2,6-diphenyl-4H-thiopyran-4-one. Representative carboxylic acid esters include ethyl benzoate, n-heptyl benzoate, and phenyl benzoate.

Other readily available dissolution inhibitors are triarylmethane dyes, such as ethyl violet, crystal violet, malachite green, brilliant green, Victoria blue B, Victoria blue R, Victoria blue BO, BASONYL Violet 610. These compounds can also act as contrast dyes that distinguish the unimaged regions from the imaged regions in the developed imageable element.

When a dissolution inhibitor compound is present in the outer layer, it typically comprises at least about 0.1 weight %, more generally from about 0.5 to about 30 weight %, and preferably from about 1 to about 15 weight %, based on the dry weight of the outer layer.

Alternatively, or additionally, the polymer binder in the outer layer can comprise polar groups that act as acceptor sites for hydrogen bonding with the hydroxy groups present in the polymeric material and, thus, act as both the binder and dissolution inhibitor. These derivatized polymeric materials can be used alone in the outer layer, or they can be combined with other polymeric materials and/or solubility-suppressing components. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically from about 0.5 mol % to about 5 mol %, and preferably from about 1 mol % to about 3 mol %, of the hydroxyl groups will be derivatized.

One group of polymeric materials that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolak resin in which from about 1 to about 3 mol % of the hydroxyl groups has been converted to phenyl sulfonate or p-toluene sulfonate (tosyl) groups.

Another group of polymeric materials that comprise polar groups and function as dissolution inhibitors are derivatized phenolic resins that contain the diazonaphthoquinone moiety. Polymeric diazonaphthoquinone compounds include derivatized resins formed by the reaction of a reactive derivative that contains diazonaphthoquinone moiety and a polymeric material that contains a suitable reactive group, such as a hydroxyl or amino group. Derivatization of phenolic resins with compounds that contain the diazonaphthoquinone moiety is known in the art and is described, for example, in U.S. Pat. Nos. 5,705,308 and 5,705,322 (both West, et al.). An example of a resin derivatized with a compound that comprises a diazonaphthoquinone moiety is P-3000 (available from PCAS, France), and is a naphthoquinone diazide of a pyrogallol/acetone resin.

To prevent ablation during imaging with infrared radiation, the outer layer is substantially free of radiation absorbing compounds. That is, the radiation absorbing compounds in the outer layer, if any, absorb less than about 10% of the imaging radiation, preferably less than about 3% of the imaging radiation, and the amount of imaging radiation absorbed by the outer layer, if any, is not enough to cause ablation of the outer layer.

The outer layer can also include other components such as surfactants, dispersing aids, humectants, biocides, viscosity builders, drying agents, antifoaming agents, preservatives, antioxidants, colorants, and contrast dyes. Coating surfactants are particularly useful.

The outer layer generally has a dry coating coverage of from about 0.2 to about 2 $g/m^2$ and preferably from about 0.4 to about 1 $g/m^2$.

Although not preferred, there may be a separate layer that is disposed between the inner and outer layers. This separate layer (or interlayer) can act as a barrier to minimize migration of radiation absorbing compounds from the inner layer to the outer layer. This interlayer generally comprises a polymeric material that is soluble in an alkaline developer. A preferred polymeric material of this type if a poly(vinyl alcohol). Generally, the interlayer should be less than one-fifth as thick as the inner layer and preferably less than one-tenth as thick as the outer layer.

Preparation of the Imageable Element

The imageable element can be prepared by sequentially applying an inner layer formulation over the surface of the substrate (and any other hydrophilic layers provided thereon), and then applying an outer layer formulation over the inner layer using conventional coating or lamination methods. It is important to avoid intermixing the inner and outer layer formulations.

The inner and outer layers can be applied by dispersing or dissolving the desired ingredients in suitable coating solvents, and the resulting formulations are sequentially or simultaneously applied to the substrate using any suitable equipment and procedures, such as spin coating, knife coating, gravure coating, die coating, slot coating, bar coating, wire rod coating, roller coating, or extrusion hopper coating. The formulations can also be applied by spraying onto a suitable support (such as an on-press printing cylinder).

The selection of solvents used to coat both the inner and outer layers depend upon the nature of the polymeric materials and other components in the formulations. To prevent the inner and outer layer formulations from mixing or the inner layer dissolving when the outer layer formulation is applied, the outer layer should be coated from a solvent in which the polymeric material(s) of the inner layer are insoluble. Generally, the inner layer formulation is coated out of a solvent mixture of methyl ethyl ketone (MEK), 1-methoxypropan-2-ol, γ-butyrolactone, and water, a mixture of diethyl ketone (DEK), water, methyl lactate, and γ-butyrolactone, or a mixture of methyl lactate, methanol, and dioxolane. The outer layer formulation is generally coated out of DEK, a mixture of DEK and 1-methoxy-2-propyl acetate, or a mixture of 1,3-dioxolane, 1-methoxypropan-2-ol (or Dowanol PM or PGME), γ-butyrolactone, and water.

Alternatively, the inner and outer layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps may also help in preventing the mixing of the various layers.

Representative methods for preparing imageable elements of this invention are shown in the Examples below.

The imageable elements have any useful form including, but not limited to, printing plate precursors, printing cylinders, printing sleeves and printing tapes (including flexible printing webs). Preferably, the imageable members are printing plate precursors to provide lithographic printing plates.

Printing plate precursors can be of any useful size and shape (for example, square or rectangular) having the requisite inner and outer layers disposed on a suitable substrate. Printing cylinders and sleeves are known as rotary printing members having the substrate and inner and outer layers in a cylindrical form. Hollow or solid metal cores can be used as substrates for printing sleeves.

Imaging and Development

During use, the imageable element is exposed to a suitable source of imaging radiation (such as infrared radiation) using a laser at a wavelength of from about 600 to about 1200 nm and preferably from about 700 to about 1200 nm. The lasers used to expose the imaging member of this invention are preferably diode lasers, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of from about 800 to about 850 nm or from about 1040 to about 1120 nm.

The imaging apparatus can function solely as a platesetter or it can be incorporated directly into a lithographic printing press. In the latter case, printing may commence immediately after imaging, thereby reducing press set-up time considerably. The imaging apparatus can be configured as a flatbed recorder or as a drum recorder, with the imageable member mounted to the interior or exterior cylindrical surface of the drum. Examples of useful imaging apparatus is available as models of Creo Trendsetter® imagesetters available from Creo Corporation (a subsidiary of Eastman Kodak Company, Burnaby, British Columbia, Canada) that contain laser diodes that emit near infrared radiation at a wavelength of about 830 nm. Other suitable imaging sources include the Gerber Crescent 42T Platesetter that operates at a wavelength of 1064 nm (available from Gerber Scientific, Chicago, Ill.) and the Screen PlateRite 4300 series or 8600 series platesetters (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging speeds may be in the range of from about 50 to about 1500 mJ/cm$^2$, and more particularly from about 75 to about 400 mJ/cm$^2$.

While laser imaging is preferred in the practice of this invention, imaging can be provided by any other means that provides thermal energy in an imagewise fashion. For example, imaging can be accomplished using a thermoresistive head (thermal printing head) in what is known as "thermal printing" as described for example in U.S. Pat. No. 5,488,025 (Martin et al.) and as used in thermal fax machines and sublimation printers. Thermal print heads are commercially available (for example, as Fujitsu Thermal Head FTP-040 MCS001 and TDK Thermal Head F415 HH7-1089).

In any case, direct digital imaging is generally used for imaging. The image signals are stored as a bitmap data file on a computer. Such files may be generated by a raster image processor (RIP) or other suitable means. The bitmaps are constructed to define the hue of the color as well as screen frequencies and angles.

Imaging of the imageable element produces an imaged element that comprises a latent image of imaged (exposed) and non-imaged (non-exposed) regions. Developing the imaged element with a suitable alkaline developer removes the exposed regions of the outer layer and the layers (including the inner layer) underneath it, and exposing the hydrophilic surface of the substrate. Thus, the imageable element is "positive-working". The exposed (or imaged) regions of the hydrophilic surface repel ink while the unexposed (or non-imaged) regions of the outer layer accept ink.

More particularly, development is carried out for a time sufficient to remove the imaged (exposed) regions of the outer layer and underlying layers, but not long enough to remove the non-imaged (non-exposed) regions of the outer layer. Thus, the imaged (exposed) regions of the outer layer are described as being "soluble" or "removable" in the alkaline developer because they are removed, dissolved, or dispersed within the alkaline developer more readily than the non-imaged (non-exposed) regions of the outer layer. Thus, the term "soluble" also means "dispersible".

The imaged elements are generally developed using conventional processing conditions. Both aqueous alkaline developers and solvent-based alkaline developers (which are preferred) can be used.

Aqueous alkaline developers generally have a pH of at least 7 and preferably of at least 11. Useful alkaline aqueous developers include 3000 Developer, 9000 Developer, GoldStar™ Developer, GreenStar Developer, ThermalPro Developer, Protherm® Developer, MX1813 Developer, and MX1710 Developer (all available from Kodak Polychrome Graphics a subsidiary of Eastman Kodak Company). These compositions also generally include surfactants, chelating agents (such as salts of ethylenediaminetetraacetic acid), and alkaline components (such as inorganic metasilicates, organic metasilicates, hydroxides, and bicarbonates).

Solvent-based alkaline developers are generally single-phase solutions of one or more organic solvents that are miscible with water. Useful organic solvents the reaction products of phenol with ethylene oxide and propylene oxide [such as ethylene glycol phenyl ether (phenoxyethanol)], benzyl alcohol, esters of ethylene glycol and of propylene glycol with acids having 6 or less carbon atoms, and ethers of ethylene glycol, diethylene glycol, and of propylene glycol with alkyl groups having 6 or less carbon atoms, such as 2-ethylethanol and 2-butoxyethanol. The organic solvent(s) is generally present in an amount of from about 0.5 to about 15% based on total developer weight. It is particularly desirable that the alkaline developer contain one or more thiosulfate salts or amino compounds that include an alkyl group that is substituted with a hydrophilic group such as a hydroxy group, polyethylene oxide chain, or an acidic group having a pKa less than 7 (more preferably less than 5) or their corresponding salts (such as carboxy, sulfo, sulfonate, sulfate, phosphonic acid, and phosphate groups). Particularly useful amino compounds of this type include, but are not limited to, monoethanolamine, diethanolamine, glycine, alanine, aminoethylsulfonic acid and its salts, aminopropylsulfonic acid and its salts, and Jeffamine compounds (for example, an amino-terminated polyethylene oxide).

Representative solvent-based alkaline developers include ND-1 Developer, 955 Developer and 956 Developer (available from Kodak Polychrome Graphics a subsidiary of Eastman Kodak Company).

Generally, the alkaline developer is applied to the imaged element by rubbing or wiping the outer layer with an applicator containing the developer. Alternatively, the imaged element can be brushed with the developer or the developer may be applied by spraying the outer layer with sufficient force to remove the exposed regions. Still again, the imaged element can be immersed in the developer. In all instances, a developed image is produced in a lithographic printing plate having excellent resistance to press room chemicals.

Following development, the imaged element can be rinsed with water and dried in a suitable fashion. The dried element can also be treated with a conventional gumming solution (preferably gum arabic).

The imaged and developed element can also be baked in a postbake operation that can be carried out to increase run length of the resulting imaged element. Baking can be carried out, for example at from about 220° C. to about 240° C. for from about 7 to about 10 minutes, or at about 120° C. for 30 minutes.

Printing can be carried out by applying a lithographic ink and fountain solution to the printing surface of the imaged element. The ink is taken up by the non-imaged (non-exposed or non-removed) regions of the outer layer and the fountain solution is taken up by the hydrophilic surface of the substrate revealed by the imaging and development process. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

The following examples are provided to illustrate the practice of the invention but are by no means intended to limit the invention in any manner.

Materials and Methods Used in the Examples:

Rohamere 6852-0 has the following structure:

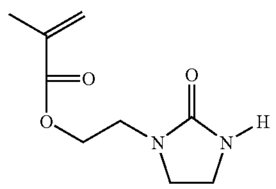

and is available from Degussa (Darmstadt, Germany) as a 50% solution in water.

N-hydroxymethylmethacrylamide is available from ABCR GmbH KG (Karlsruhe, Germany) as a 60% solution in water.

Substrate A was a 0.3 gauge aluminum sheet that had been electrograined, anodized, and treated with a solution of poly(vinyl phosphonic acid).

IR dye A has the following structure:

IR DYE A

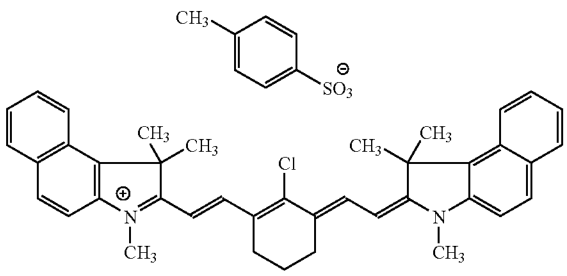

Byk® 307 is a polyethoxylated dimethylpolysiloxane copolymer that is available from BYK Chemie (Wallingford, Conn.).

956 Developer is a solvent-based developer (containing phenoxyethanol) that is available from Kodak Polychrome Graphics (Norwalk, Conn.), a subsidiary of Eastman Kodak Company.

PD140A is a novolak resin (75% m-cresol, 25% p-cresol, mw 7000) that is available from Borden Chemical (Louisville, Ky.).

P3000 is a 1,2-naphthoquinonediazide-5-sulfonate ester of pyrogallol acetone condensate that is available from PCAS (Longjumeau, France).

Ethyl violet (basic violet 4, C.I. 42600) is available from Aldrich Chemical Company (Milwaukee, Wis.).

D11 dye is a triarylmethane dye that is available from PCAS (Longjumeau, France) and is represented by the following structure:

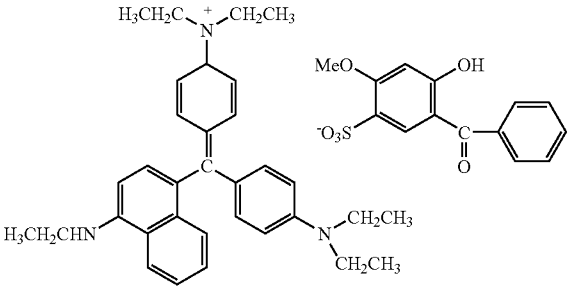

Synthetic Method:

The following synthetic procedures were carried out using the following sequence of steps:

a) All reactants were placed into a four-neck, round bottom flask (1 liter) equipped with a condenser, a nitrogen supply, a thermometer, a stirrer, and a heating mantle, the reaction vessel also containing 1,3-dioxolane/water [90:10 (v:v); 451.41 g].

b) Nitrogen was supplied to the reaction solution by attaching a nitrogen bubbler to the inlet, and the nitrogen outlet (top of condenser) was connected to a Dreschel bottle and a positive nitrogen pressure was maintained for one hour.

c) The temperature was raised to 60° C.

d) 2,2'-Azobis(isobutyronitrile) (AIBN, 0.034 g) was dissolved in 1,3-dioxolane (0.50 g) and added to the reaction mixture.

e) The reaction mixture was stirred for 24 hours while maintaining a constant 60° C. under nitrogen.

f) The resulting polymer was isolated by precipitation by adding the polymer solution slowly, with stirring, to ethanol/water [(80/20) 1000 ml+5 drops of HCL]. The precipitate is filtered and washed with ethanol/water [(80/20) 1000 ml] and filtered again.

g) The precipitated was dried to constant weight (for about 2 days) at 40° C.

Synthetic Preparation 1:

Copolymer 1 (36.26 g, 71% yield) was prepared from 30 mol % N-phenylmaleimide (14.97 g), 15 mol % methacrylamide (3.68 g), 20 mol % methacrylic acid (4.96 g), 20 mol % Rohamere 6852-0 (22.84 g), and 15 mol % N-hydroxymethyl methacrylamide (8.29 g) using the noted synthetic method.

Synthetic Preparation 2:

Copolymer 2 (30.43 g, 59% yield) was prepared from 30 mol % N-phenylmaleimide (14.03 g), 15 mol % methacrylamide (3.45 g), 20 mol % methacrylic acid (4.65 g), 20 mol % Rohamere 6852-0 (21.41 g) and 15 mol % N-(p-hydroxyphenyl) methacrylamide (7.18 g) using the noted synthetic method.

Synthetic Preparation 3:

Copolymer 3 (36.36 g, 74% yield) was prepared from 30 mol % N-phenylmaleimide (13.18 g), 15 mol % methacrylamide (3.24 g), 20 mol % methacrylic acid (4.37 g), 20 mol % Rohamere 6852-0 (20.12 g), and 15 mol % N-(p-aminosulfonylphenyl) methacrylamide (9.15 g) using the noted synthetic method.

Synthetic Preparation 4:

Copolymer 4 (31.60 g, 72% yield) was prepared from 30 mol % N-phenylmaleimide (14.74 g), 15 mol % methacrylamide (3.62 g), 20 mol % methacrylic acid (4.89 g), 20 mol % Rohamere 6852-0 (22.50 g), and 15 mol % N-methoxymethyl methacrylamide (3.62 g) using the noted synthetic method.

Synthetic Preparation 5:

Copolymer 5 (21.91 g, 43% yield) was prepared from 30 mol % N-phenylmaleimide (14.13 g), 15 mol % methacrylamide (3.47 g), 20 mol % methacrylic acid (4.68 g), 20 mol % Rohamere 6852-0 (21.56 g), and 15 mol % N-[3-(dimethylamino)propyl]methacrylamide (6.94 g) using the noted synthetic method.

Synthetic Preparation 6:

Copolymer 6 (56.93 g, 94% yield) was prepared from 30 mol % N-phenylmaleimide (21.74 g), 20 mol % methacrylic acid (7.21 g), 20 mol % Rohamere 6852-0 (33.19 g), and 30 mol % N-hydroxymethylmethacrylamide (24.09 g) using the noted synthetic method.

Synthetic Preparation 7:

Copolymer 7 (58.21 g, 97% yield) was prepared from 41.5 mol % N-phenylmaleimide (32.39 g), 21 mol % methacrylic acid (8.15 g), and 37.5 mol % N-hydroxymethylmethacrylamide (32.43 g) using the noted synthetic method.

Synthetic Preparation 8:

Copolymer 8 (42.62 g, 85% yield) was prepared from 41.5 mol % N-phenylmaleimide (31.00 g), 21 mol % methacrylic acid (6.77 g), and 37.5 mol % methacrylamide (14.21 g) using the noted synthetic method.

Synthetic Preparation 9:

Copolymer 9 (18.13 g, 91% yield) was prepared from 30 mol % N-phenylmaleimide (7.65 g), 20 mol % methacrylic acid (2.53 g), 25 mol % methacrylamide (3.13 g), 20 mol % Rohamere 6852-0 (11.67 g), and 5 mol % N-hydroxymethylmethacrylamide (1.41 g) using the noted synthetic method.

Synthetic Preparation 10:

Copolymer 10 (18.88 g, 94% yield) was prepared from 35 mol % N-phenylmaleimide (9.01 g), 20 mol % methacrylic acid (2.56 g), 25 mol % methacrylamide (3.16 g), 15 mol %

Rohamere 6852-0 (8.84 g), and 5 mol % N-hydroxymethylmethacrylamide (1.43 g) using the noted synthetic method.

Synthetic Preparation 11:

Copolymer 11 (16.55 g, 83% yield) was prepared from 25 mol % N-phenylmaleimide (6.32 g), 20 mol % methacrylic acid (2.51 g), 25 mol % methacrylamide (3.10 g), 25 mol % Rohamere 6852-0 (14.46 g), and 5 mol % N-hydroxymethylmethacrylamide (1.40 g) using the noted synthetic method.

Synthetic Preparation 12:

Copolymer 12 (30.66 g, 77% yield) was prepared from 25 mol % N-phenylmaleimide (13.45 g), 20 mol % methacrylic acid (5.35 g), 25 mol % methacrylamide (6.61 g), 15 mol % Rohamere 6852-0 (18.47 g), and 15 mol % N-hydroxymethylmethacrylamide (8.94 g) using the noted synthetic method.

Synthetic Preparation 13

Copolymer 13 (37.80 g, 95% yield) was prepared from 30 mol % N-phenylmaleimide (17.87 g), 25 mol % methacrylic acid (7.40 g), 30 mol % methacrylamide (8.78 g), and 15 mol % N-hydroxymethylmethacrylamide (9.90 g) using the noted synthetic method.

INVENTION EXAMPLE 1 AND COMPARATIVE EXAMPLES 1 TO 4

Coating solutions containing the components as described in Table I below were coated onto Substrate A using a wire wound bar out of 1,3-dioxolane:PGME:γ-butyrolactone:water (65:15:10:10 weight ratio). The resulting polymer layers were dried at 135° C. for 30 seconds. The coating weight of each resulting polymer layer was 1.5 g/m$^2$.

TABLE I

| | Expressed as % dry coating of film | | | | | | | |
|---|---|---|---|---|---|---|---|---|
| Example | Copolymer 1 | Copolymer 2 | Copolymer 3 | Copolymer 4 | Copolymer 5 | IR Dye A | Byk ® 307 | D11 |
| Invention 1 | 83.0 | | | | | 15.0 | 0.5 | 1.5 |
| Comparative 1 | | 83.0 | | | | 15.0 | 0.5 | 1.5 |
| Comparative 2 | | | 83.0 | | | 15.0 | 0.5 | 1.5 |
| Comparative 3 | | | | 83.0 | | 15.0 | 0.5 | 1.5 |
| Comparative 4 | | | | | 83.0 | 15.0 | 0.5 | 1.5 |

The dried samples were subjected to the following tests:

Developer solubility: Drops of 956 Developer were applied to the dried polymer layer at 2-second intervals up to 30 seconds, and then washed off immediately with water. The time taken to fully dissolve the polymer layer was recorded.

Resistance to UV wash: Drops of diacetone alcohol/water (4:1) were placed on each dried polymer layer at one-minute intervals up to 5 minutes, and then washed off with water. An estimation of the amount of polymer layer remaining after 5 minutes was made.

Resistance to alcohol-sub fountain solution: Drops of butyl cellosolve (BC):water (4:1 volume ratio) were placed on each dried polymer layer at 1-minute intervals up to 5 minutes, and then washed off with water. An estimation of the amount of polymer layer remaining after 5 minutes was made.

Baking test: The dried polymer layer was baked in a Mathis laboratory drier at 230° C. for 8 minutes with a fan speed of 1000 rpm. The positive image remover, PE3S (available from Kodak Polychrome Graphics, Japan Ltd) was applied at 2-minute intervals up to 10 minutes, and then rinsed with water. The polymer layer was considered to be 100% bakeable if the deletion gel was unable to remove any coating. The coating was considered to be 50% bakeable if the deletion gel was able to remove 50% of the coating.

The results of these tests having the dried polymer layers described in TABLE I are provided the following TABLE II.

TABLE II

| Example | Drop Test 956 Developer (seconds) | UV Wash (% coating remaining after 5 minutes) | BC/water Resistance (% coating remaining after 5 minutes) | Baking Test |
|---|---|---|---|---|
| Invention 1 | 8 | 25 | 75 | 100% bakeable |
| Comparative 1 | 8 | 0 | 50 | Not bakeable |
| Comparative 2 | 12 | 0 | 60 | Not bakeable |
| Comparative 3 | 6 | 0 | 30 | 80% bakeable |
| Comparative 4 | 40 | 0 | 0 | Not bakeable |

An upper layer formulation described in TABLE III below (diethyl ketone) was coated onto the dried polymer layers described above by means of a wire wound bar. The formulation concentration was selected to provide a dry film having a coating weight of 0.7 g/m$^2$. The upper layer coating was dried at 135° C. for 30 seconds.

TABLE III

| Component | Parts by Weight |
|---|---|
| PD140A | 69.1 |
| P3000 | 30 |
| Ethyl Violet | 0.4 |
| Byk ® 307 | 0.5 |

The resulting imageable elements were evaluated using the following test:

The elements were imagewise exposed with 830 nm radiation on a commercially available Creo 3244 Trendsetter. Plot 0 internal test patterns were applied at 8 watts with exposure energies of 130, 120, 110, 100, 90, 80 and 70 mJ/cm$^2$.

The imaged elements were then developed in a Kodak Polychrome Graphics 85N processor using 956 Developer at 25° C. at a processing speed of 5 feet per minute. The elements were then evaluated for "cleanout" (that is, the lowest energy needed to completely remove exposed areas using the developer) and the best resolution (that is, the imaging energy at which the element performs best). The results are provided in the following TABLE IV.

TABLE IV

| | Minimum exposure required (mJ/cm$^2$) | |
|---|---|---|
| Example | Cleanout | Best Resolution |
| Invention 1 | 110 | 110 |
| Comparative 1 | 110 | 120 |
| Comparative 2 | 120 | 130 |
| Comparative 3 | 110 | 120 |
| Comparative 4 | >130 | >130 |

INVENTION EXAMPLE 2 AND COMPARATIVE EXAMPLE 5

Coating formulations were made containing the components described in the following TABLE V, coated onto Substrate A, and dried as described in Invention Example 1. The coating weight of the resulting polymer layer was 1.5 g/m$^2$. The dried polymers layers were evaluated using the same tests described above for Invention Example 1 and the results are shown in the following TABLE VI.

TABLE V

| | Expressed as % dry coating of film | | | | |
|---|---|---|---|---|---|
| Example | Copolymer 7 | Copolymer 8 | IR Dye A | Byk ® 307 | D11 |
| Invention 2 | 83.0 | | 15.0 | 0.5 | 1.5 |
| Comparative 5 | | 83.0 | 15.0 | 0.5 | 1.5 |

TABLE VI

| Example | Drop Test 956 Developer (seconds) | UV Wash (% coating remaining after 5 minutes) | BC/Water (% coating remaining after 5 minutes) | Baking Test |
|---|---|---|---|---|
| Invention 2 | 4 | 40 | 50 | 30% bakeable |
| Comparative 5 | 6 | 40 | 50 | Not bakeable |

An upper layer formulation described in TABLE VII below (diethyl ketone) was coated onto the dried polymer layers described above by means of a wire wound bar. The formulation concentration was selected to provide a dry film having a coating weight of 0.7 g/m$^2$. The upper layer coating was dried at 135° C. for 30 seconds.

TABLE VII

| Component | Parts by Weight |
|---|---|
| PD140A | 69.1 |
| P3000 | 30 |
| Ethyl Violet | 0.4 |
| Byk ® 307 | 0.5 |

The resulting imageable elements were evaluated using the same test described for Invention Example 1 and the results are shown in the following TABLE VIII.

TABLE VIII

| | Minimum exposure required (mJ/cm$^2$) | |
|---|---|---|
| Example | Cleanout | Best Resolution |
| Invention 2 | 130 | 130 |
| Comparative 5 | 120 | 130 |

EXAMPLES 3 TO 5

Coating formulations were made containing the components described in the following TABLE IX, coated onto Substrate A, and dried as described in Invention Example 1. The coating weight of the resulting polymer layer was 1.5 g/m$^2$. The dried polymers layers were evaluated using the same tests described above for Invention Example 1 and the results are shown in the following TABLE X.

TABLE IX

| | Expressed as % dry coating of film | | | | | |
|---|---|---|---|---|---|---|
| Example | Copolymer 9 | Copolymer 10 | Copolymer 11 | IR dye A | Byk ® 307 | D11 |
| Invention 3 | 83.0 | | | 15.0 | 0.5 | 1.5 |
| Invention 4 | | 83.0 | | 15.0 | 0.5 | 1.5 |
| Invention 5 | | | 83.0 | 15.0 | 0.5 | 1.5 |

TABLE X

| Example | Drop Test 956 Developer (seconds) | UV Wash (% coating remaining after 5 minutes) | BC/water (% coating remaining after 5 minutes) | Baking Test |
|---|---|---|---|---|
| Invention 3 | 2 | 10 | 70 | Not bakeable |
| Invention 4 | 2 | 5 | 60 | 10% bakeable |
| Invention 5 | 2 | 15 | 70 | 10% bakeable |

An upper layer formulation described in TABLE XI below (diethyl ketone) was coated onto the dried polymer layers described above by means of a wire wound bar. The formulation concentration was selected to provide a dry film having a coating weight of 0.7 g/m$^2$. The upper layer coating was dried at 135° C. for 30 seconds.

TABLE XI

| Component | Parts by Weight |
|---|---|
| PD140A | 69.1 |
| P3000 | 30 |
| Ethyl Violet | 0.4 |
| Byk ® 307 | 0.5 |

The resulting imageable elements were subjected to the same "cleanout" test as described for Invention Example 1 and the results are provided in the following TABLE XII.

TABLE XII

| Example | Minimum exposure required for cleanout (mJ/cm$^2$) |
|---|---|
| Invention 3 | 110 |
| Invention 4 | 110 |
| Invention 5 | 110 |

EXAMPLE 6

A coating formulation was made containing the components described in the following TABLE XIII, coated onto Substrate A, and dried as described in Invention Example 1. The coating weight of the resulting polymer layer was 1.5 g/m$^2$. The dried polymers layers were evaluated using the same tests described above for Invention Example 1 and the results are shown in the following TABLE XIV.

TABLE XIII

| | Expressed as % dry coating of film | | | |
|---|---|---|---|---|
| Example | Copolymer 12 | IR dye A | Byk ® 307 | D11 |
| Invention 6 | 83.0 | 15.0 | 0.5 | 1.5 |

TABLE XIV

| Example | Drop Test 956 Developer (seconds) | UV Wash (% coating remaining after 5 minutes) | BC/water (% coating remaining after 5 minutes) | Baking Test |
|---|---|---|---|---|
| Invention 6 | 8 | 60 | 90 | 90% bakeable |

An upper layer formulation described in TABLE XV below (diethyl ketone) was coated onto the dried polymer layers described above by means of a wire wound bar. The formulation concentration was selected to provide a dry film having a coating weight of 0.7 g/m$^2$. The upper layer coating was dried at 135° C. for 30 seconds.

TABLE XV

| Component | Parts by Weight |
|---|---|
| PD140A | 69.1 |
| P3000 | 30 |
| Ethyl Violet | 0.4 |
| Byk ® 307 | 0.5 |

The resulting imageable elements were subjected to the same test as described for Invention Example 1 above and the results are shown in the following TABLE XVI.

TABLE XVI

| Example | Minimum exposure required for cleanout (mJ/cm$^2$) |
|---|---|
| Invention 6 | 100 |

The invention has been described in detail with particular reference to certain preferred embodiments thereof, but it will be understood that variations and modifications can be effected within the spirit and scope of the invention.

The invention claimed is:

1. A positive-working imageable element comprising a radiation absorbing compound and a substrate having a hydrophilic surface, and having thereon, in order:

an inner layer comprising a polymeric material that is removable using an alkaline developer and in which from about 1 to about 50 mol % of its recurring units are derived from one or more of the ethylenically unsaturated polymerizable monomers represented by the following Structure (I):

$$CH_2{=}C(R^1)C({=}O)NR^2(CR^3R^4)_nOH \quad (I)$$

wherein $R^1$, $R^2$, $R^3$, and $R^4$ are independently hydrogen, lower alkyl, or phenyl, and n is 1 to 20, and an ink receptive outer layer that is substantially free of said radiation absorbing compound and is not removable by an alkaline developer prior to thermal imaging, provided upon thermal imaging, the imaged regions of said element are removable by an alkaline developer.

2. The imageable element of claim 1 wherein said inner layer polymeric material is represented by the following Structure (II):

$$-(A)_x-(B)_y-(C)_z- \quad (II)$$

wherein A represents recurring units represented by the following Structure (Ia):

(Ia)

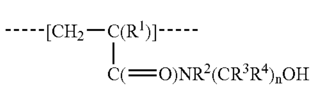

B represents recurring units comprising acidic functionality or an N-maleimide group, and C represents recurring units different from A and B, x is from about 1 to about 50 mol %, y is from about 40 to about 90 mol %, and z is 0 to about 70 mol %, based on total recurring units.

3. The imageable element of claim 2 wherein x is from about 10 to about 40 mol %, y is from about 40 to about 70 mol %, and z is from 0 to about 50 mol %, based on total recurring units.

4. The imageable element of claim 2 wherein:

A represents recurring units derived from one or both of N-hydroxymethylacrylamide and N-hydroxymethylmethacrylamide, B represents recurring units derived from one or more of N-phenylmaleimide, N-cyclohexylmaleimide, N-benzylmaleimide, N-(4-carboxyphenyl)maleimide, (meth) acrylic acid, and vinyl benzoic acid, C represents recurring units derived from one or more of a styrenic monomer, meth(acrylate) ester, N-substituted (meth)acrylamide, maleic anhydride, (meth)acrylonitrile, allyl acrylate, and a compound represented by the following Structure (III):

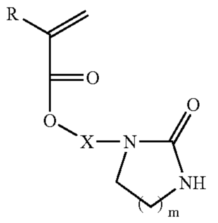

(III)

wherein R is hydrogen, methyl, or halo, X is alkylene having 2 to 12 carbon atoms, and m is 1 to 3, x is from about 10 to 40 mol %, y is from about 40 to about 70 mol %, and z is from 0 to about 50 mol %, based on total recurring units.

5. The imageable element of claim 4 wherein B represents recurring units derived from at least one of N-phenylmaleimide, N-cyclohexylmaleimide, N-benzylmaleimide, N-(4-carboxyphenyl)maleimide in an amount of from about 20 to about 50 mol %, and recurring units derived from at least one of (meth)acrylic acid and vinyl benzoic acid in an amount of from about 10 to about 30 mol %, based on total recurring units.

6. The imageable element of claim 4 wherein C represents recurring units derived from methacrylamide, (meth)acrylonitrile, maleic anhydride, or

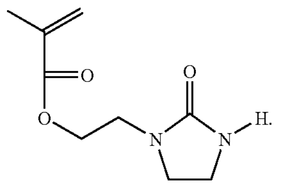

7. The imageable element of claim 1 wherein said outer layer comprises a phenolic resin and optionally at least 0.1 weight % of a dissolution inhibitor.

8. The imageable element of claim 7 wherein said phenolic resin is a novolak resin and said dissolution inhibitor is present in an amount of from about 0.5 to about 30 weight %.

9. The imageable element of claim 7 wherein said phenolic resin comprises polar groups.

10. The imageable element of claim 1 wherein said radiation absorbing compound is present exclusively in said inner layer in an amount of from at least 10 weight %.

11. The imageable element of claim 10 wherein said radiation absorbing compound is an infrared radiation absorbing compound that is a pigment or an IR dye having a high extinction coefficient of from about 700 to about 1200 nm.

12. The imageable element of claim 1 wherein said inner layer has a dry coating weight of from about 0.5 to about 2.5 $g/m^2$ and has outer layer has a dry coating weight of from about 0.2 to about 2 $g/m^2$.

13. A method for forming an image comprising:

A) thermally imaging a positive-working imageable element comprising a radiation absorbing compound and a substrate having a hydrophilic surface, and having thereon, in order:

an inner layer comprising a polymeric material that is removable using an alkaline developer and in which from about 1 to about 50 mol % of its recurring units are derived from one or more of the ethylenically unsaturated polymerizable monomers represented by the following Structure (I):

$$CH_2{=}C(R^1)C({=}O)NR^2(CR^3R^4)_nOH \quad (I)$$

wherein $R^1$, $R^2$, $R^3$, and $R^4$ are independently hydrogen, lower alkyl, or phenyl, and n is 1 to 20, and an ink receptive outer layer that is substantially free of said radiation absorbing compound and is not removable by an alkaline developer prior to thermal imaging, provided upon thermal imaging, the imaged regions of said element are removable by an alkaline developer, thereby forming an imaged element with imaged and non-imaged regions wherein said imaged regions are removable by an alkaline developer following thermal imaging of said element, B) contacting said imaged element with an alkaline developer to remove only the imaged regions, revealing the hydrophilic substrate, and C) optionally, baking said imageable element after imaging and development.

14. The method of claim 13 wherein said alkaline developer is a solvent-based alkaline developer.

15. The method of claim 13 wherein said imaged regions are formed by exposing said imageable element to a suitable source of infrared using an infrared laser at a wavelength of from about 600 to about 1200 nm.

16. The method of claim 13 wherein said imaged and developed element is a positive-working lithographic printing plate.

17. The method of claim 13 wherein said imaged and developed element is a printed circuit board or masking element.

18. The method of claim 13 wherein said inner layer polymeric material is represented by the following Structure (II):

$$—(A)_x—(B)_y—(C)_z— \quad (II)$$

wherein A represents recurring units represented by the following Structure (Ia):

(Ia)

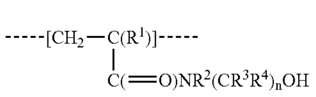

B represents recurring units comprising acidic functionality or an N-maleimide group, and C represents recurring units different from A and B, x is from about 1 to about 50 mol %, y is from about 40 to about 90 mol %, and z is 0 to about 70 mol %, based on total recurring units.

19. The method of claim 18 wherein:

A represents recurring units derived from one or both of N-hydroxymethylacrylamide and N-hydroxymethylmethacrylamide, B represents recurring units derived from one or more of N-phenylmaleimide, N-cyclohexylmaleimide, N-benzylmaleimide, N(4-carboxyphenyl)maleimide, (meth) acrylic acid, and vinyl benzoic acid, C represents recurring units derived from one or more of a styrenic monomer, meth(acrylate) ester, N-substituted (meth)acrylamide, maleic anhydride, (meth)acrylonitrile, allyl acrylate, and a compound represented by the following Structure (III):

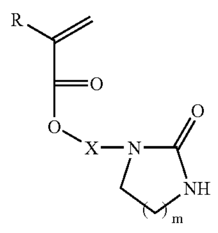

(III)

wherein R is hydrogen, methyl, or halo, X is alkylene having 2 to 12 carbon atoms, and m is 1 to 3, x is from about 10 to 40 mol %, y is from about 40 to about 70 mol %, and z is from 0 to about 50 mol %, based on total recurring units.

20. An image obtained from the method of claim 13.

* * * * *